(12) United States Patent
Singer et al.

(10) Patent No.: US 12,374,865 B2
(45) Date of Patent: Jul. 29, 2025

(54) COMPOSITE COMPONENT MADE OF OPTICAL COMPONENTS, METHOD FOR PRODUCING A COMPOSITE COMPONENT AND DEVICE COMPRISING AN OPTICAL COMPONENT

(71) Applicant: OSRAM OLED GmbH, Regensburg (DE)

(72) Inventors: Frank Singer, Regenstauf (DE); Hubert Halbritter, Dietfurt (DE)

(73) Assignee: OSRAM OLED GMBH, Regensburg (DE)

( * ) Notice: Subject to any disclaimer, the term of this patent is extended or adjusted under 35 U.S.C. 154(b) by 937 days.

(21) Appl. No.: 16/977,174

(22) PCT Filed: Feb. 5, 2019

(86) PCT No.: PCT/EP2019/052779
§ 371 (c)(1),
(2) Date: Sep. 1, 2020

(87) PCT Pub. No.: WO2019/166195
PCT Pub. Date: Sep. 6, 2019

(65) Prior Publication Data
US 2021/0048594 A1 Feb. 18, 2021

(30) Foreign Application Priority Data
Mar. 2, 2018 (DE) .................... 102018104778.9

(51) Int. Cl.
*H01S 5/185* (2021.01)
*G02B 3/00* (2006.01)
(Continued)

(52) U.S. Cl.
CPC ............ *H01S 5/185* (2021.01); *G02B 3/00* (2013.01); *G02B 7/021* (2013.01);
(Continued)

(58) Field of Classification Search
CPC ...................... H01S 5/18388; H01S 5/185
See application file for complete search history.

(56) References Cited

U.S. PATENT DOCUMENTS

| | | | |
|---|---|---|---|
| 6,142,358 A | 11/2000 | Cohn et al. | |
| 8,252,662 B1 * | 8/2012 | Poblenz | H01L 33/0095 |
| | | | 438/33 |

(Continued)

FOREIGN PATENT DOCUMENTS

| | | |
|---|---|---|
| CN | 102903804 A | 1/2013 |
| CN | 104350613 A | 2/2015 |

(Continued)

*Primary Examiner* — Michael Carter
(74) *Attorney, Agent, or Firm* — MH2 Technology Law Group LLP

(57) ABSTRACT

A composite component, a device, and method for producing the composite component including a plurality of optical components, a removable sacrificial layer, a retaining structure and a common intermediate carrier are provided, wherein the optical components each have an optical element for shaping a light beam and the sacrificial layer is arranged in the vertical direction at least in places between the intermediate carrier and the optical components. The retaining structure includes retaining elements, wherein the retaining structure and the sacrificial layer form a mechanical connection between the intermediate carrier and the optical components. The optical components are mechanically connected to the intermediate carrier only via the retaining structure, wherein the retaining elements are formed in such a way that under mechanical load they release the optical components so that the optical components are formed to be detachable from the intermediate carrier and thus transferable.

15 Claims, 9 Drawing Sheets

Figure 1A:
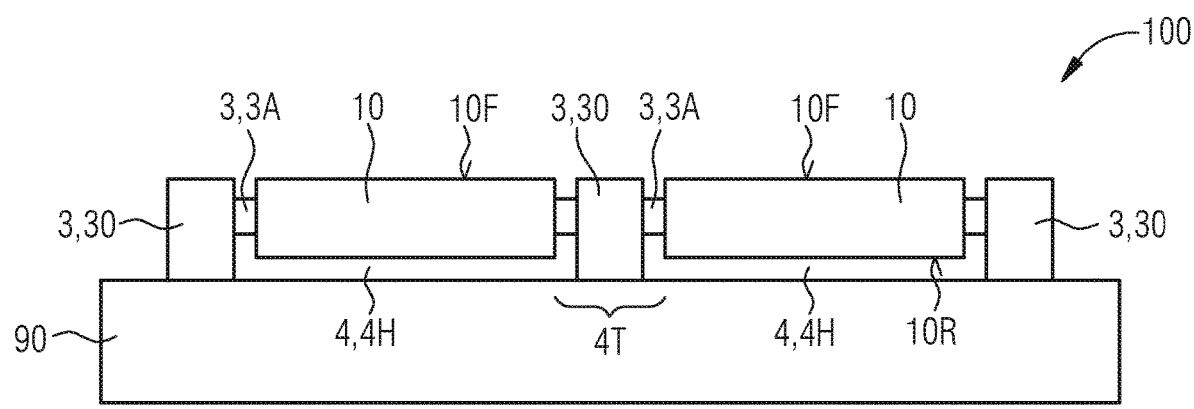

(51) Int. Cl.
*G02B 7/02* (2021.01)
*H01S 5/02253* (2021.01)
*H01S 5/026* (2006.01)
*H01S 5/183* (2006.01)

(52) U.S. Cl.
CPC .......... *H01S 5/02253* (2021.01); *H01S 5/026* (2013.01); *H01S 5/18388* (2013.01); *G02B 2003/0093* (2013.01)

(56) References Cited

U.S. PATENT DOCUMENTS

| | | | |
|---|---|---|---|
| 8,399,275 B2 | 3/2013 | Akimoto et al. | |
| 9,466,769 B2 | 10/2016 | Halbritter et al. | |
| 9,601,356 B2 | 3/2017 | Bower et al. | |
| 9,640,715 B2* | 5/2017 | Bower | H01L 33/0095 |
| 11,061,276 B2* | 7/2021 | Cok | G02F 1/133606 |
| 2003/0189212 A1 | 10/2003 | Yoo | |
| 2005/0174767 A1* | 8/2005 | Flaherty | H01L 33/58 |
| | | | 257/E33.059 |
| 2011/0297985 A1 | 12/2011 | Naka | |
| 2012/0182623 A1* | 7/2012 | Wippermann | B29C 33/52 |
| | | | 264/1.7 |
| 2013/0250432 A1 | 9/2013 | Wippermann et al. | |
| 2013/0273695 A1 | 10/2013 | Menard et al. | |
| 2013/0285086 A1 | 10/2013 | Hu et al. | |
| 2015/0371874 A1 | 12/2015 | Bower et al. | |
| 2015/0380619 A1 | 12/2015 | Bower et al. | |
| 2016/0104695 A1 | 4/2016 | Yeh et al. | |
| 2018/0006186 A1 | 1/2018 | Bower et al. | |
| 2018/0047879 A1 | 2/2018 | Racz et al. | |
| 2018/0145211 A1 | 5/2018 | Halbritter et al. | |
| 2018/0159302 A1* | 6/2018 | McLaurin | H01L 24/83 |
| 2018/0204772 A1 | 7/2018 | Bower et al. | |
| 2018/0301874 A1* | 10/2018 | Burroughs | G01J 1/44 |

FOREIGN PATENT DOCUMENTS

| | | |
|---|---|---|
| CN | 106716610 A | 5/2017 |
| CN | 107408608 A | 11/2017 |
| CN | 107636848 A | 1/2018 |
| DE | 10042947 A1 | 3/2002 |
| DE | 112005000117 T5 | 11/2006 |
| DE | 102009055088 A1 | 6/2011 |
| DE | 102015112627 A1 | 2/2016 |
| DE | 102015103571 A1 | 9/2016 |
| TW | 201306242 A | 2/2013 |

* cited by examiner

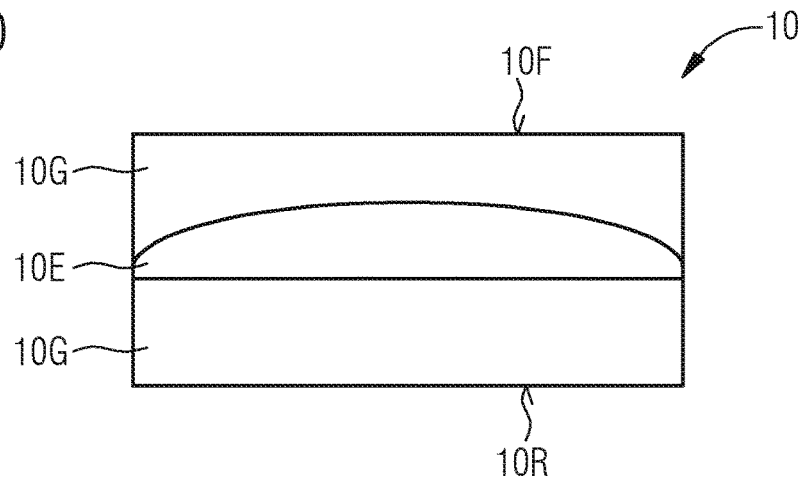
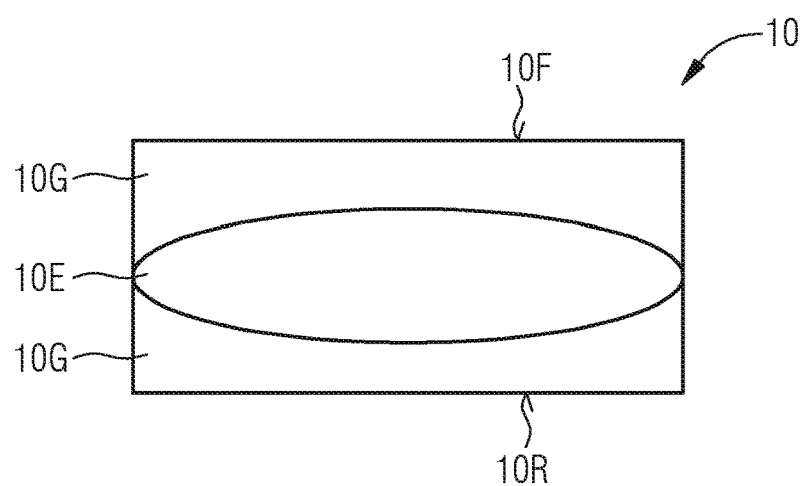
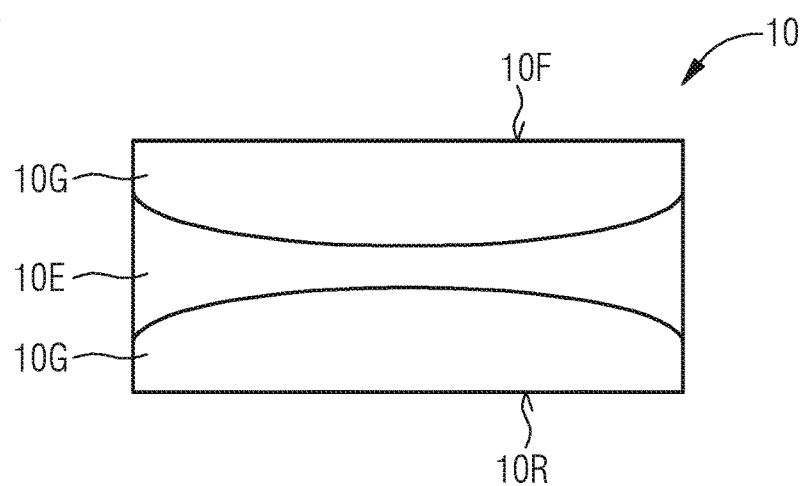

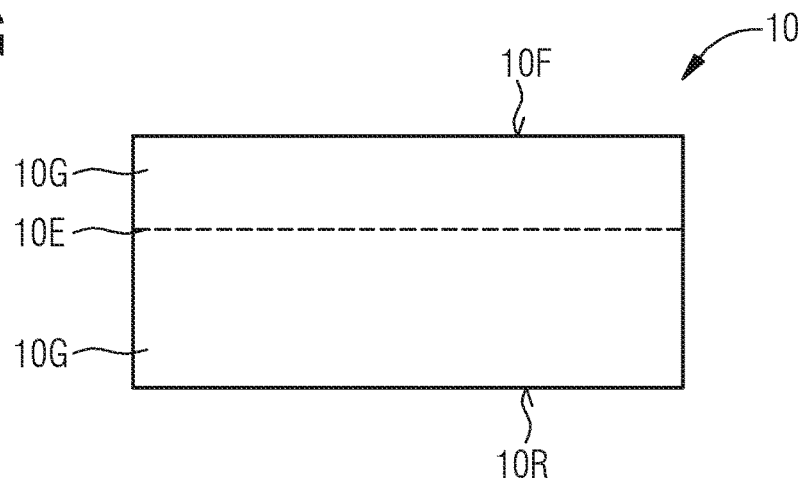
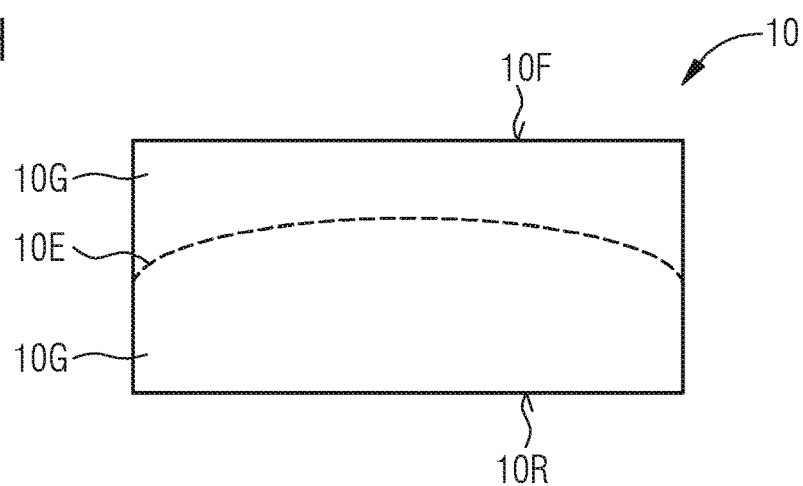
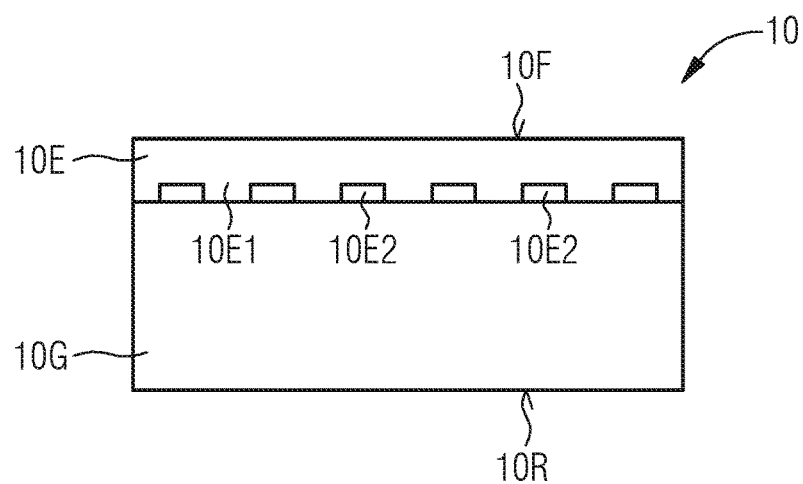

COMPOSITE COMPONENT MADE OF OPTICAL COMPONENTS, METHOD FOR PRODUCING A COMPOSITE COMPONENT AND DEVICE COMPRISING AN OPTICAL COMPONENT

CROSS-REFERENCE TO RELATED APPLICATIONS

This patent application is a national stage entry from International Application No. PCT/EP2019/052779, filed on Feb. 5, 2019, published as International Publication No. WO 2019/166195 A1 on Sep. 6, 2019, and claims priority under 35 U.S.C. § 119 from German patent application 10 2018 104 778.9, filed Mar. 2, 2018, the entire contents of all of which are incorporated herein by reference.

A composite component comprising a plurality of optical components is provided, wherein the optical components are particularly transferable and thus preferably printable. Furthermore, a method for producing a composite component, a method for producing a device or a plurality of the devices and a device having an optical component are specified.

Optical components, such as optical structures, are often produced on a substrate and mounted individually on devices such as semiconductor chips. Attaching and fixing a large number of optical components to the devices is time-consuming and cost-intensive.

One object is to specify optical components that can be mounted on devices quickly, reliably and in a simplified manner. Another objects are to specify reliable and cost-efficient methods for producing a composite component or a plurality of the devices having such optical components.

These objects are solved by the composite component, by the method and the device according to the independent claims and in connection with such a method or with such a composite component. Further embodiments and further developments of the method, the composite component or the device are subject matter of the further claims.

In accordance with at least one embodiment of the method for producing a composite component, a plurality of optical components are formed on an intermediate carrier. The intermediate carrier can be formed from a transparent material, for example glass, or from a semiconductor material, for example silicon. In particular, the method is directed towards the production of a plurality of transferable and in particular printable optical components on a common intermediate carrier, wherein the optical components are formed preferably to be detachable from the intermediate carrier. For example, using a stamp or several stamps, the optical components can be printed individually one after the other or in groups simultaneously on target mounting surfaces, for example on one device or on several devices.

The optical component described here is configured in particular to shape a light beam. In particular, the optical component is an optical chip, for example a diffractive optics, a refractive optics, a collimation optics or a diffusor structure. The device or the plurality of the devices can be formed to generate or detect electromagnetic radiation in the UV, IR or visible spectral range, for example.

According to at least one embodiment of the method, a sacrificial layer is arranged vertically between the intermediate carrier and the optical components. For example, the sacrificial layer is formed from a material such as germanium or silicon. The sacrificial layer can be formed on the intermediate carrier before or during the production of the optical components on the intermediate carrier. With respect to the intermediate carrier and the optical components, the sacrificial layer may be formed of a selectively removable material. For example, the material of the sacrificial layer is chosen such that it can be dissolved by an etching process without damaging the intermediate carrier and/or the optical components.

A lateral direction is understood to mean a direction which is in particular parallel to a main extension surface of the intermediate carrier and/or of the optical component. For example, the lateral direction is parallel to the sacrificial layer. A vertical direction is understood to mean a direction which is directed in particular perpendicular to the main extension surface of the intermediate carrier and/or of the optical component. The vertical direction and the lateral direction are in particular orthogonal to each other.

According to at least one embodiment of the method, a retaining structure having a plurality of retaining elements is formed. In particular, the retaining structure is formed in such a way that the optical components are mechanically connected to the intermediate carrier only via the retaining structure, especially after the removal of the sacrificial layer. In other words, after removing the sacrificial layer, the optical components may be mechanically connected to the intermediate carrier exclusively via the retaining structure, for example exclusively via the retaining elements of the retaining structure. If the optical component is mechanically connected to the intermediate carrier only or exclusively through the retaining elements, the mechanical connection between the intermediate carrier and the optical components can be broken if the retaining elements are separated or detached from the intermediate carrier or from the optical components.

In at least one embodiment of a method, a plurality of optical components are mounted or formed on the intermediate carrier. The optical components can be produced directly on the intermediate carrier or they can be produced in a separate method step and fixed on the intermediate carrier. In particular, the optical components are configured to shape a light beam. In particular, a retaining structure having a plurality of retaining elements provides or forms a mechanical connection between the intermediate carrier and the optical components. A sacrificial layer is arranged in the vertical direction at least in places between the intermediate carrier and the optical components. In order to produce a plurality of transferable optical components on the common intermediate carrier, the optical components are preferably mechanically connected to the intermediate carrier only via the retaining structure once the sacrificial layer has been removed. Expediently, the retaining elements are formed in such a way that they release the optical components under mechanical load, so that the optical components are detachable from the intermediate carrier and are thus transferable.

Due to the retaining structure, the optical components are kept in order and sufficiently stable on the intermediate carrier, especially after the removal of the sacrificial layer and before they can be removed from the intermediate carrier individually or in groups for further processing steps in a targeted and safe manner. The optical components are thus printable individually or in groups. In other words, the optical components are removable from the intermediate carrier individually or in groups, in particular by breaking and/or by detaching the retaining elements, and are transferable to a target mounting surface and mechanically fixed to it, for example by using a stamp or several stamps, for instance in the same production step. The target mounting surface can be the surface of an optoelectronic device, such as an optoelectronic semiconductor chip.

An optical component produced by this method has a particularly thin vertical layer thickness. In particular, the vertical layer thickness of the entire optical component is less than 40 µm, 30 µm, 20 µm, 10 µm or less than 5 µm. For example, the vertical layer thickness of the entire optical component is between 1 µm and 10 µm, between 1 µm and 10 µm, between 1 µm and 5 µm, for instance 3 µm.

In at least one embodiment of a composite component, it comprises a plurality of optical components, a removable sacrificial layer, a retaining structure and a common intermediate carrier. Preferably, the optical components each have an optical element for shaping a light beam. The sacrificial layer is arranged in the vertical direction at least in places between the intermediate carrier and the optical components. The retaining structure has a plurality of retaining elements, wherein the retaining structure and/or the sacrificial layer form/s a mechanical connection between the intermediate carrier and the optical components. Preferably, without the sacrificial layer the optical components are mechanically connected to the intermediate carrier only via the retaining structure, in particular exclusively via the retaining elements. Under mechanical load, the retaining elements are preferably formed in such a way that they release the optical components so that the optical components are detachable from the intermediate carrier and are thus transferable.

Such a composite component contains a plurality of detachable and thus transferable and in particular printable optical components, wherein the sacrificial layer can be removed from the composite component if required. In the presence of the sacrificial layer, however, the optical components continue to be held in a mechanically stable manner on the intermediate carrier so that the transport of such a composite component can be carried out without high risk of breakage.

If the optical components are mechanically connected to the intermediate carrier only via the retaining elements, the optical components can be detached from the intermediate carrier by breaking or removing the retaining elements. The retaining elements can be directly or indirectly adjacent to the optical components and/or the intermediate carrier.

In accordance with at least one embodiment of the method or the composite component, the retaining elements are formed with regard to their geometry and/or material composition preferably in such a way that they are broken off, torn off or detached from the intermediate carrier or from the optical components under mechanical load and thereby release the components. The mechanical load can be a tensile or compressive force exerted on the retaining structure and/or on the retaining elements. If the retaining elements are formed to break under mechanical load, they may break or tear off when the associated component is removed. A mechanical break may be achievable for instance within one layer of the same material. If the retaining elements are formed to be detachable, the detachment of the retaining elements from the optical component or from the intermediate carrier takes place for instance at an interface between the retaining element and the optical component or at an interface between the retaining element and the intermediate carrier, thus usually at an interface between two layers of different materials.

According to at least one embodiment of the method or of the composite component, the retaining structure is contained at least partially in the sacrificial layer. The retaining structure may comprise retaining columns which are completely enclosed in lateral directions by the sacrificial layer. In particular, the retaining columns are arranged below the optical components. In a plan view of the intermediate carrier, the optical components may cover, in particular completely cover, the retaining columns associated with them. The retaining columns are arranged in the vertical direction for instance between the intermediate carrier and the optical components.

In addition or alternatively, the retaining structure may include retaining tethers. The retaining tethers are arranged in particular sidewards to the optical components. The retaining elements can be made of an electrically insulating material. The retaining elements are preferably formed to be breakable when the associated component is pressed towards the intermediate carrier. The retaining tethers can be arranged on different side faces of the optical component or on different side faces of a base body of the optical component. The retaining tethers can mechanically connect the optical component or the optical components with one retaining bar or several retaining bars, wherein the retaining bar is spaced apart from the optical components in the lateral direction. In particular, the retaining bar is an integral part of the retaining structure. The retaining bar may be directly adjacent to the intermediate carrier and/or directly adjacent to the retaining tethers. The retaining bar and the retaining tethers may be made of the same material or of different materials. The retaining structure may have a plurality of such retaining bars.

According to at least one embodiment of the method or of the composite component, the retaining tethers are located exclusively sidewards to the optical components and are formed to be breakable or detachable under mechanical load when the optical components are removed. In particular, the retaining tethers are formed in such a way, for example with regard to their geometries and/or materials, that they break under the effect of pressure. For example, the retaining elements are made of an electrically insulating material, such as a polymer, a plastic material, silicon nitride or silicon oxide.

According to at least one embodiment of the method or the composite component, the retaining elements comprise retaining columns located below the optical components. In the vertical direction, the retaining columns are arranged in particular exclusively between the intermediate carrier and the optical components. The retaining column may be made of a material which is more resistant to etching than the material of the sacrificial layer. For example, the retaining columns are made of an electrically insulating material such as silicon dioxide, plastic or other plastic material. It is also possible that the retaining elements, in particular the retaining tethers and/or the retaining columns, are formed from an electrically conductive material, for example from a metal such as copper, aluminum, nickel, chromium, platinum or alloys thereof.

In accordance with at least one embodiment of the method or the composite component, the retaining elements are preferably formed with regard to their geometry and/or material composition in such a way that they are formed to be breakable when the associated optical component is pressed or removed.

According to at least one embodiment of the method or of the composite component, the sacrificial layer forms a common boundary layer between the intermediate carrier and the components. In particular, the sacrificial layer directly adjoins the intermediate carrier and/or directly adjoins the retaining structure, in particular directly adjoins the retaining elements. Without the sacrificial layer, for example after removal of the sacrificial layer, an interspace, for example a cavity, is formed between the intermediate carrier and the optical components. The retaining elements, such as the retaining columns and/or the retaining tethers, may in places directly adjoin the cavity or be arranged in the cavity. The retaining elements are preferably surrounded by the cavity, so that the retaining elements can be mechanically broken comparatively more easily when force or pressure is applied.

According to at least one embodiment of the method or of the composite component, the optical components each have an optical element. In particular, the optical element is a diffractive optical element (DOE). The optical element or the optical elements is/are configured to shape a light beam, such as a laser light beam, in particular to expand and distribute the light beam. The optical component can be configure to distribute a light beam, for example a laser light beam, over a larger solid angle range or to direct or focus a light beam. The optical element forms in particular an optically effective structure of the optical component which determines the path of the light beam within the optical component and/or after leaving the optical component.

The optical element of the optical component can be curved in a convex or concave, plano-convex, plano-concave or convex-concave manner. The optical element of the optical component can have diffraction elements or photonic crystals. The optical element can also be a grid-like structure which acts similar to a diffraction grid and/or a hologram for the light beam, for example for laser radiation.

According to at least one embodiment of the method or of the composite component, the optical element of the optical component is formed from a III-V or a II-VI compound semiconductor material. In particular, the optical element comprises one or more different materials having a refractive index of at least 1.5, 1.6, 1.8 or of at least 2.0, for instance between 1.5 and 3 inclusive or between 1.8 and 2.5 inclusive. In case of doubt, the refractive index indicated here refers to a wavelength of 632.8 nm. The optical component or the optical element may comprise SiO, SiN, ZnO, ZnS, ZnTe, Ga2O3, In2O3, ZnO, SnO2 or Ta2O5. Other examples of materials for the optical element include aluminum oxide, such as Al2O3, GaAs or GaN.

According to at least one embodiment of the method or the composite component, the optical components each have a base body. In particular, the optical element of the respective component is formed by the geometry of the associated base body. It is also possible that the optical element is arranged on the base body or embedded or buried in the base body.

According to at least one embodiment of the method or the composite component, the optical component or the base body is formed to be plano-convex or plano-concave. The components can each have a planar rear side facing the intermediate carrier. It is possible that the optical component or the base body has a flat or planar rear side facing the intermediate carrier and an at least flat front side facing away from the intermediate carrier.

According to at least one embodiment of the method or the composite component, the optical components each have a base body, wherein the optical element of the respective component is embedded in the associated base body. The optical element is for example a diffractive optical element.

According to at least one embodiment of the method or the composite component, the optical components each have a transparent base body. The transparent base body may contain photonic crystals which form the optical element of the respective component.

According to at least one embodiment of the method or the composite component, the optical element of the respective component is formed by an optical layer. The optical layer is arranged in particular on the associated base body of the optical component. The optical layer can have substructures made of a material having a refractive index of at least 1.5 or 1.6. For example, the substructures are made of silicon nitride or Ta2O5. The substructures can be embedded in a matrix material having a lower refractive index, for example less than 1.5 or less than 1.6. The matrix material can be formed from silicon oxide, for example silicon dioxide.

According to at least one embodiment of the method or the composite component, the optical component or the base body has a planar rear side facing the intermediate carrier and a front side facing away from the intermediate carrier which is at least flat or planar. It is possible that the component has a protective layer or a cover layer which is arranged between the base body and the intermediate carrier. The protective layer or cover layer can be planarized so that the protective layer or cover layer has a surface that forms a planar rear side of the optical component.

According to at least one embodiment of an optical component, which is produced in particular according to a method described here and/or is detached from the common carrier of the composite component described here, it is an electrically insulating component. In particular, the optical component is free of an optically active layer which is formed to generate or detect electromagnetic radiation. In other words, the optical component, which is formed to shape a light beam, is not configured to generate or detect electromagnetic radiation. The component may have remnants or traces in virtue of separation from the retaining elements.

In accordance with at least one embodiment of a method for producing one or a plurality of the devices, in particular of optoelectronic devices, a composite component described here is provided. In a subsequent method step, the sacrificial layer is removed. One of the optical components or a plurality of optical components can be removed by using one or a plurality of stamps, wherein the retaining elements release the components under mechanical load of the stamp or stamps so that the components are detached from the intermediate carrier.

The optical component or the plurality of optical components can be printed on a target surface, such as a main body of the device or a plurality of main bodies of the device. For example, the main body comprises a semiconductor body having an active zone configured to generate or detect electromagnetic radiation. The stamp or plurality of stamps can then be separated from the optical component or from the components. The optical components can thus be transferred individually or in groups from the composite component to one or more target surfaces, for example to surfaces of semiconductor chips.

According to at least one embodiment of the method for producing one or a plurality of the devices, the optical component is fixed on the associated main body of the device by a connection layer. The connection layer can be an adhesion promoter layer such as a solder layer or adhesive layer.

Alternatively, it is possible that the optical component and its associated main body each have a planar surface and are mechanically bonded together at the planar surfaces using a direct bonding process. For example, the planar surfaces of the optical component and/or the main body are formed at least in places or completely by surfaces of electrically insulating layers, for example of silicon nitride, and/or by surfaces of semiconductor layers. It is also possible that the planar surface of the main body is formed in places or completely by a surface of a transparent electrically conductive layer, for example a TCO layer. The planar surface has a roughness which is preferably at most 50 nm, 20 nm, 10 nm, 5 nm or at most 3 nm.

In a direct bonding process, planar or in particular planarized surfaces are brought into physical contact. The mechanical bond is mainly or exclusively based on hydrogen bonds and/or Van-der-Waals-interactions in the immediate vicinity of a common interface between the planarized surfaces. For forming covalent bonds between atoms or molecules on the surfaces being in physical contact, a thermal treatment can be applied to achieve increased bond strength.

In at least one embodiment of a device, it has a main body and an optical component. The main body comprises a semiconductor body in particular having an active zone which is configured to generate or detect electromagnetic radiation. The optical component comprises an optical element for shaping a light beam. For example, the optical component is printed on the main body and contains in particular mechanical traces of detached or broken retaining elements. The mechanical traces may be remnants or traces of mechanical breakage of one or several retaining elements.

According to at least one embodiment of the device, the optical component and the main body each have a planar surface. In particular, the planar surfaces directly adjoin each other and form a mechanical connection between the optical component and the main body which is based on van der Waals interactions. The optical component and the main body may have a common interface which is in particular planar and free of a connecting material. The common interface is, for example, free of a solder or bonding material. The common interface is in particular an overlapping surface between the planarized surfaces of the optical component and of the main body of the device.

The methods described here are particularly suitable for the production of an optical component, composite component or device described here. The features described in connection with the component, composite component or device can therefore also be used for the respective methods, and vice versa.

Further preferred embodiments and further developments of the optical component, composite component, device and the respective method will become apparent from the exemplary embodiments explained below in conjunction with FIGS. 1A to 4D.

Figure 1B:
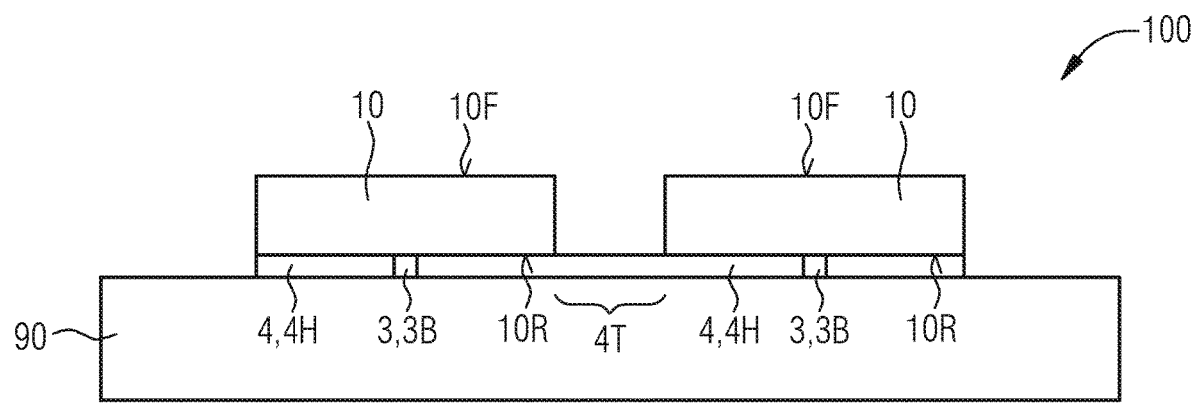
Figure 1C:
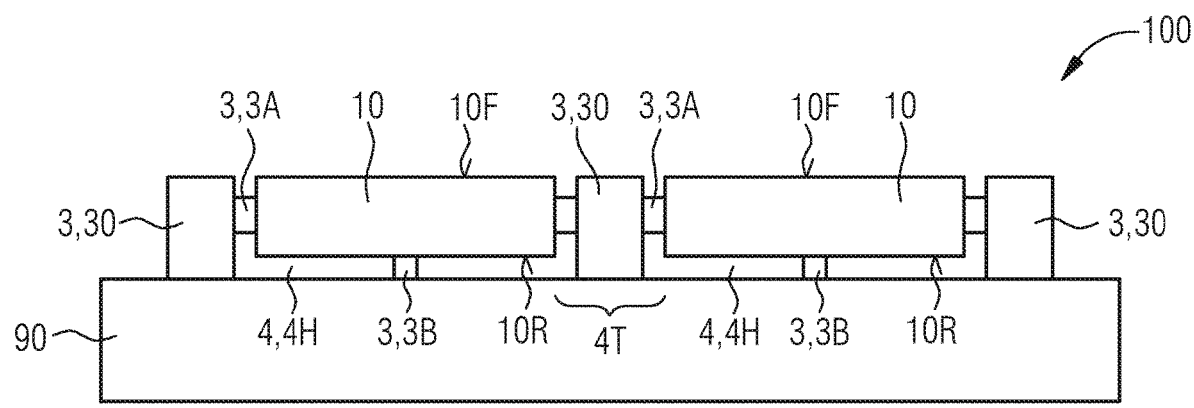
Figure 1D:
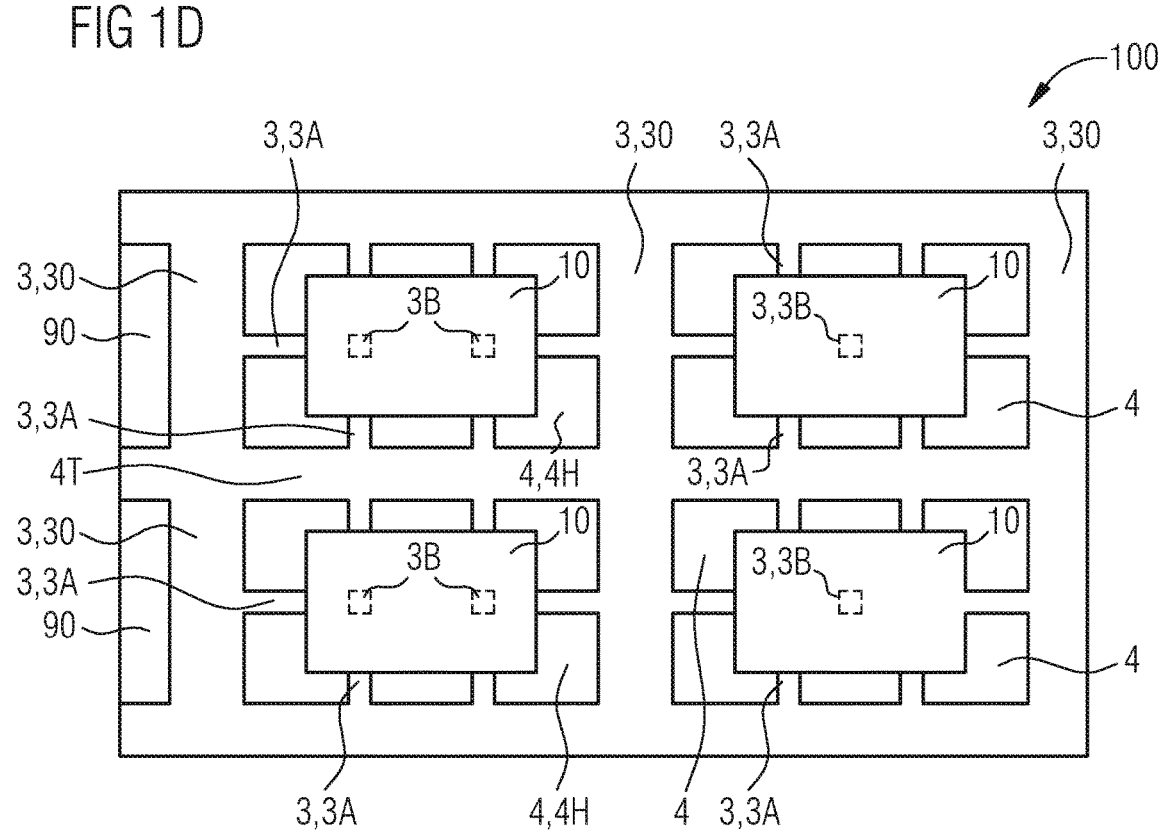
Figure 2A:
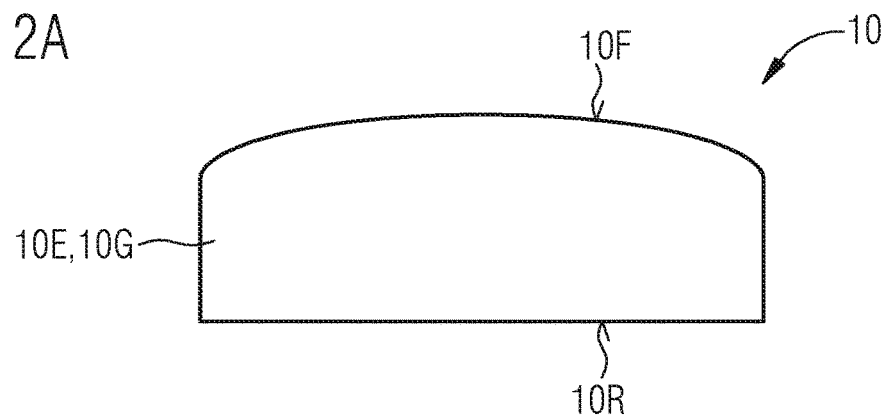
Figure 2B:
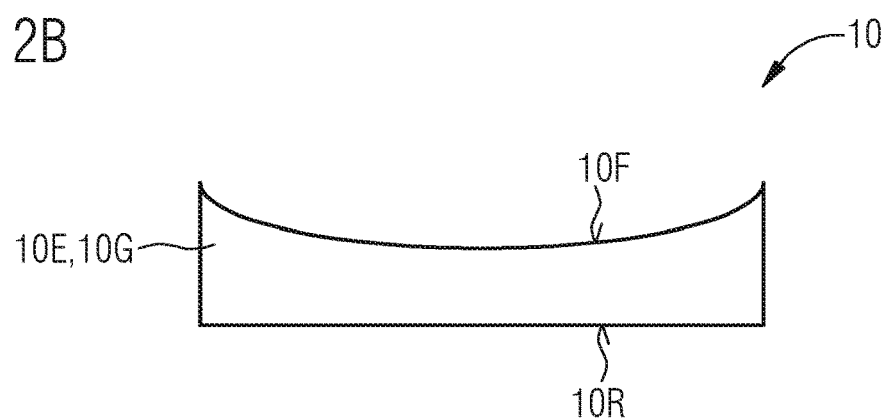
Figure 2C:
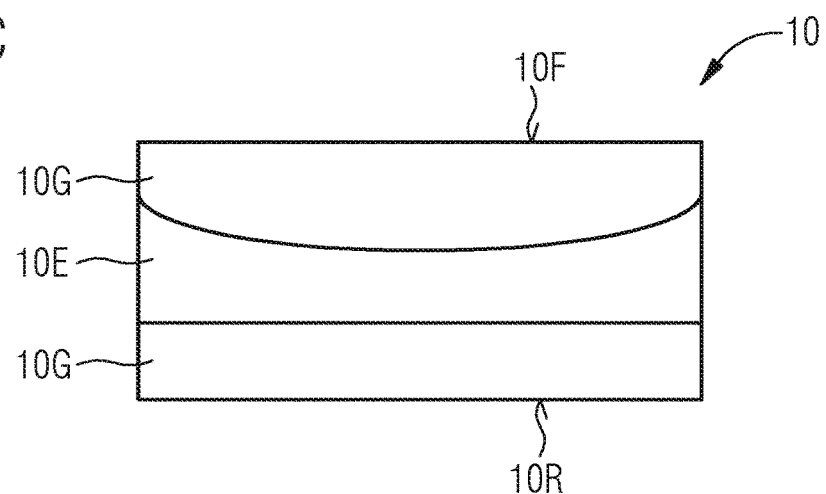
Figure 2J:
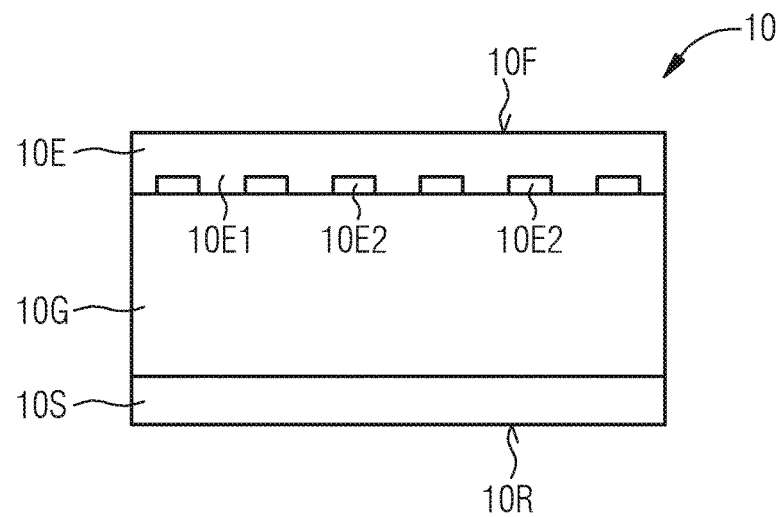
Figure 3A:
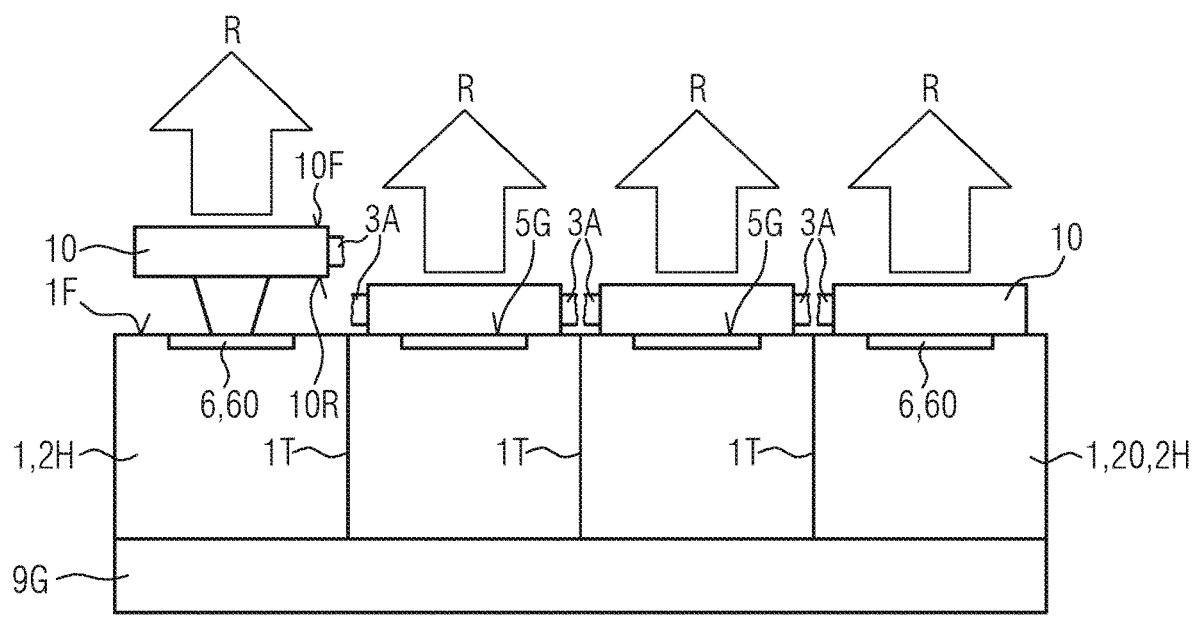
Figure 3B:
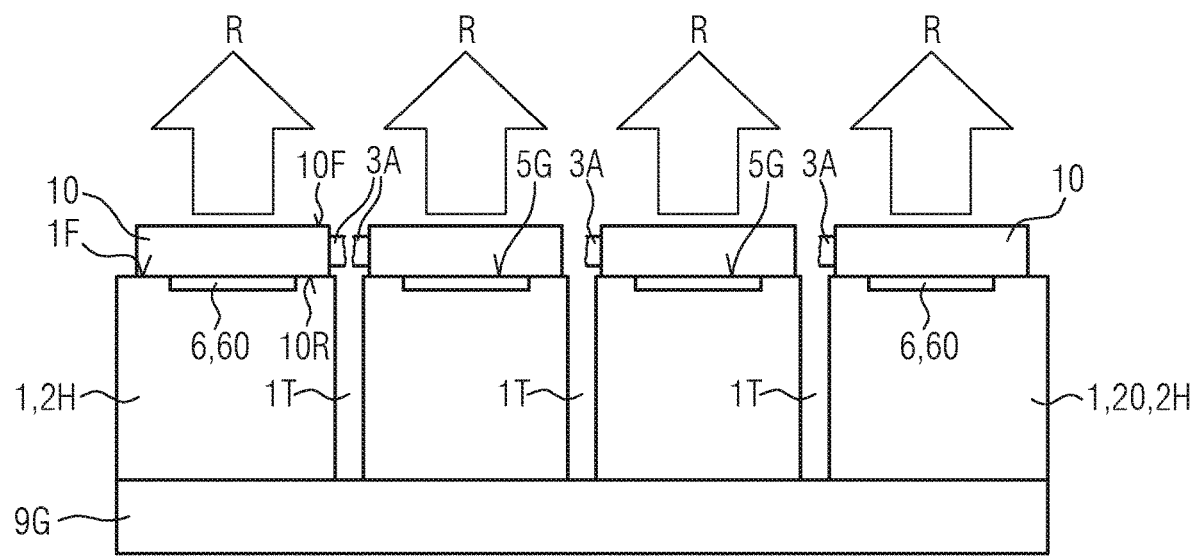
Figure 3C:
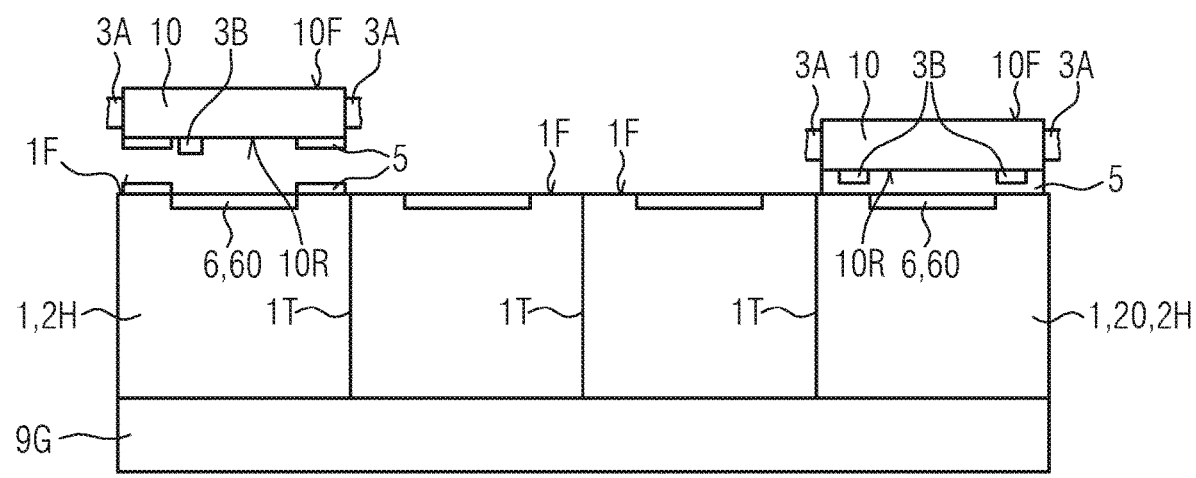

FIGS. 1A, 1B, 1C and 1D show schematic representations of different embodiments of a composite component comprising a plurality of optical components in sectional views, FIGS. 2A, 2B, 2C, 2D, 2E, 2F, 2G, 2H, 2I and 2J show schematic representations of various embodiments of an optical component in sectional views, FIGS. 3A, 3B and 3C show schematic representations of some of the steps in the method of producing one device or a plurality of devices in sectional views; and FIGS. 4A, 4B, 4C and 4D show schematic illustrations of some exemplary embodiments of a device in sectional views.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

FIG. 1A schematically shows a composite component 100 having a plurality of optical components 10 on a common intermediate carrier 90. The subcarrier 90 can be a glass substrate or a substrate made of a semiconductor material such as silicon. The optical components 10 are manufactured in particular on the intermediate carrier 90. In the lateral directions, the optical components 10 are spatially separated from one another, in particular by separation trenches 4T.

According to FIG. 1A, the optical components 10 are mechanically connected to the intermediate carrier 90 via a sacrificial layer 4 and/or a retaining structure 3 and are thus mechanically fixed to the intermediate carrier 90. In particular, the sacrificial layer 4 is directly adjacent to the intermediate carrier 90 and/or to the retaining structure 3. Preferably, the sacrificial layer 4 is formed from a removable material, for example an etchable material. With regard to the materials of the optical components 10 and the intermediate carrier 90, the material of the sacrificial layer 4 is preferably selectively removable. For example, the material of the sacrificial layer 4 has a higher etching rate than a material of the intermediate carrier 90 and/or of the retaining structure 3, in particular an etching rate at least 5 times, 10 times, 20 times or 100 times higher.

Along the vertical direction, the sacrificial layer 4 is located between the intermediate carrier 90 and the optical components 10. The optical components 10 each have a front side 10F facing away from the intermediate carrier 90 and a rear side 10R facing towards the intermediate carrier 90. The rear side 10R and/or the front side 10F of the respective optical component 10 can be planar or flat. In particular, the front side 10F is free from being covered by the sacrificial layer 4. The rear side 10R may be partially or completely covered by the sacrificial layer 4, in particular completely except for the retaining structure 3. As shown in FIG. 1A, the optical components 10 have vertically extending side faces which are in particular partially covered by the sacrificial layer 4.

As shown in FIG. 1A, the retaining structure 3 contains a plurality of retaining elements 3A. The retaining structure 3 has a plurality of retaining bars 30, especially in the areas of the separation trenches 4T. The retaining bars 30 can be directly or indirectly adjacent to the intermediate carrier 90. The retaining elements 3A are in particular formed as retaining tethers 3A according to FIG. 1A. The retaining tethers 3A are arranged sidewards to the optical components 10. An optical component 10 may have a plurality of retaining tethers 3A, for example at least two, three, four or at least six such retaining tethers 3A. Compared to the retaining tethers 3A, the retaining bars 30 can have larger geometric sizes. For example, a retaining bar 30 has a lateral width or vertical height which is at least 2 times, 3 times, 4 times, 5 times or at least 10 times greater than a corresponding lateral width or vertical height of the retaining tethers 3A.

In particular, the retaining tethers 3A connect the optical components 10 to the retaining bar 30. The sacrificial layer 4 and/or the retaining structure 3 having a plurality of retaining elements 3A and retaining bar 30 can form or provide a mechanical connection between the intermediate carrier 90 and the optical components 10. It is possible that the retaining tethers 3A are directly adjacent to the optical components 10 and/or to the retaining bar 30. The retaining tethers 3A and the retaining bars 30 may be made of the same material or of different materials. It is possible that the retaining tethers 3A and the retaining bars 30 are formed in a common method step. For example, an anchoring layer is applied to a large extent to the optical components 10 and/or to the intermediate carrier 90, wherein the anchoring layer are subsequently structured into a plurality of retaining bars 30 and retaining tethers 3A.

In deviation from FIG. 1A, it is possible that the retaining structure 3 does not have retaining bars 30 or that the retaining bars 30 themselves are formed as lateral retaining tethers 3A. Along the vertical direction, such a retaining tether 3A may extend from one side face of the optical component 10 to the intermediate carrier 90.

It is possible that the optical components 10 are produced from a contiguous structure on the common intermediate carrier 90. Even after the separation of the optical components 10 by the formation of the separation trenches 4T, the optical components 10 can still be mechanically fixed on the same intermediate carrier 90.

After the removal of the sacrificial layer 4, an interspace 4H or a cavity 4H may be formed between the intermediate carrier 90 and the optical components 10. As shown in FIG. 1A, the cavity 4H may be located in the lateral direction in places between the optical component 10 and the retaining structure 3, in particular between the optical component 10 and the retaining bar 30. For example, the sacrificial layer 4 can be selectively removed, especially etched away. In particular, after removal of the sacrificial layer 4, the optical component 10 or the optical components 10 is/are mechanically connected to the intermediate carrier 90 exclusively by the retaining structure 3, in this case by the retaining bar 30 and the retaining elements 3A. Via the retaining structure 3, the optical components 10 are thus still placed in an orderly manner on the common intermediate carrier 90, wherein the optical components 10 can be detached from the intermediate carrier 90 individually or in groups, for example by breaking or detaching the retaining elements 3A.

The exemplary embodiment shown in FIG. 1B essentially corresponds to the exemplary embodiment of a composite component 100 shown in FIG. 1A. In contrast, the retaining structure 3 has a plurality of retaining columns 3B arranged along the vertical direction between the intermediate carrier 90 and the optical components 10. In a plan view of the intermediate carrier 90, an optical component 10 can cover, in particular completely cover, its associated retaining column 3B or retaining columns 3B.

As shown in FIGS. 1A and 1B, the sacrificial layer 4 may have openings filled with a material of the retaining structure 3. The sacrificial layer 4 may be continuous or have a plurality of laterally spaced sublayers. The retaining structure 3 may have a plurality of retaining columns 3B and/or retaining bars 30 in the openings of the sacrificial layer 4. The retaining columns 3B connect the intermediate carrier 90 with the optical components 10, in particular at the rear sides 10R of the optical components 10. The retaining bars 30 and the retaining tethers 3A connect the intermediate carrier 90 with the optical components 10, in particular at the side faces of the optical components 10.

With regard to the geometries and the materials, the retaining elements 3A and/or 3B are preferably formed in such a way that they are breakable or detachable under mechanical load, especially after removal of the sacrificial layer 4. The retaining tethers 3A or the retaining columns 3B may be made of an electrically insulating material or of an electrically conductive material. In particular, the material of the retaining elements 3A and/or 3B has a lower etching rate than a material of the sacrificial layer 4, for example an etching rate at least 5 times, 10 times, 20 times or 100 times lower.

In particular, the retaining elements 3A and/or 3B are formed with regard to their geometries and materials in such a way that they break off mechanically when the associated optical component 10 is pressed, and/or tear when the optical component 10 is raised, or detach from the optical component 10 or from the intermediate carrier 90. In other words, the retaining elements 3A and/or 3B can be formed in such a way that they release the optical components 10 under mechanical load, so that the optical components 10 can be detached individually or in groups from the intermediate carrier 90 and are thus formed to be transferable or printable. The retaining structure 3 has a plurality of predetermined breaking points which are formed in particular by the retaining elements 3A and/or 3B.

The exemplary embodiment of a composite component 100 shown in FIG. 1C essentially corresponds to the exemplary embodiments of a composite component 100 shown in FIGS. 2A and 2B. In contrast, the composite component 100 has a plurality of lateral retaining tethers 3A and a plurality of retaining columns 3B as retaining elements. The retaining tethers 3A can be formed at the sides of the optical components 10 in the areas of the separation trenches 4T and connect the optical components 10 with the retaining bars 30. The lateral retaining tethers 3A and/or the retaining bars 30 are produced in particular after the formation of the separation trenches 4T. The retaining columns 3B can be formed before the separation trenches 4T are formed.

The exemplary embodiment shown in FIG. 1D essentially corresponds to the exemplary embodiment of a composite component 100 shown in FIG. 1C. FIG. 1D shows the composite component 100 in a plan view of the intermediate carrier 90. A plurality of retaining elements 3A and/or 3B can be assigned to each optical component 10. The optical component 10 can have several or all side faces covered by the retaining tethers 3A in places. On the side faces of the optical component 10, the retaining tethers 3A can be essentially point-shaped. For example, in a plan view of a side face of the optical component 10, the retaining tethers 3A may cover between 0.1% and 1%, between 0.3% and 3%, between 0.5% and 5%, between 1% and 10% or between 2% and 20% of a total area of the associated side face of the optical component 10.

FIGS. 2A, 2B, 2C, 2D, 2E, 2F, 2G, 2H, 2I and 2J show different examples of the optical component 10 in sectional views. The optical component 10 has an optical element 10E. In particular, the optical element 10E is formed to shape a light beam impinging on the optical component 10. The optical element 10E can be a diffractive optical element. The component 10 has a base body 10G. The optical element 10E can be formed by the base body 10G, for example solely by the geometry and/or material composition of the base body 10G. Alternatively, it is possible that the optical element 10E is arranged on the base body 10G or embedded or buried in the base body 10G.

According to FIGS. 2A and 2B, the optical element 10E is formed by the geometry of the base body 10G. In particular, the base body 10G forms an optical lens. The base body 10G can be a glass body. The base body 10G is plano-convex as shown in FIG. 2A. The component 10 has a curved front side 10F which is formed in particular by the convex surface of the base body 10G. The component 10 has a flat or planar rear side 10R which is formed in particular by the flat or planar surface of the base body 10G. The base body 10G is plane-concave according to FIG. 2B. The curved front side 10F of the component 10 is formed in particular by the concave surface of the base body 10G. In deviation from FIGS. 2A and 2B, it is possible for the base body 10G to be biconvex, biconcave, convex-concave or concave-convex.

As shown in FIG. 2C, the optical element 10E is enclosed by the base body 10G. The optical element 10E is located at least partially or completely within the base body 10G. In particular, the optical element 10E is an optical lens. The optical lens may have the usual shapes of a lens described in particular in connection with the base body 10G described in FIGS. 2A and 2B. In FIG. 2C, the optical element 10E has a plano-concave shape.

According to FIG. 2C, the front side 10F and the rear side 10R of the optical component are flat or planar. The front side 10F and the rear side 10R can be formed by surfaces of the base body 10G. The base body 10G may be formed of a material that is transparent to radiation, in particular transparent. It is possible that the optical element 10E is a glass body. Furthermore, it is conceivable that the base body 10G and the optical element 10E are made of materials having different refractive indices. For example, a refractive index of the optical element 10E differs by at least 0.2, 0.3 or 0.5 from the refractive index of the base body 10G. The optical element 10E may have a higher refractive index than the base body 10G. It is also conceivable that the optical element 10E and/or the base body 10G are/is formed of a semiconductor material.

The exemplary embodiments shown in FIGS. 2D, 2E and 2F essentially correspond to the exemplary embodiment of an optical component 10 shown in FIG. 2C. In contrast, the optical element 10E in FIGS. 2D, 2E and 2F is formed to be plano-convex, biconvex or biconcave.

The exemplary embodiments shown in FIGS. 2G and 2H essentially correspond to the exemplary embodiment of an optical component 10 shown in FIG. 2C. In contrast, the optical element 10E according to FIGS. 2G and 2H is formed in particular as a diffractive optical element 10E. The optical element 10E can be formed as a flat or curved layer within the base body 10G. The optical element 10E may be formed from photonic crystals or from highly refractive materials. The optical element 10E may also have diffraction elements or a grid-like structure that acts/acts in a similar way to a diffraction grid.

According to FIG. 2I, the optical element 10E is formed by an optical layer which is arranged on the associated base body 10G. The optical layer can have substructures 10E2, for example micro- or nanostructures. The substructures 10E2 can be formed from a material having a refractive index of at least 1.5 or 1.6, or 2.0. The substructures 10E2 can be embedded in a matrix material 10E1, in particular having a lower refractive index, for example having a refractive index that is at least 0.2 or 0.3 or 0.5 lower. The front side 10F of the optical component 10 can be formed by a surface of the optical layer. The optical layer is in particular a separate layer of the optical component 10.

The exemplary embodiment shown in FIG. 2J essentially corresponds to the exemplary embodiment of an optical component 10 shown in FIG. 2I. In contrast, the optical component 10 has a cover layer 10S which is formed in particular as a protective layer of the optical component 10. The cover layer 10S can be directly or indirectly adjacent to the base body 10G. In particular, the rear side 10R of the optical component 10 is formed by a surface of the cover layer 10S. The cover layer 10S can be formed from an electrically insulating material, for example from silicon nitride or silicon oxide. The optical components 10 shown in FIGS. 2A, 2B, 2C, 2D, 2E, 2F, 2G and 2H may also have such a cover layer 10S. Such a cover layer 10S can be planarized and is particularly suitable for a direct bonding process in which the optical component 10 is attached to a target surface.

According to FIG. 3A, a plurality of devices 1 or a plurality of main bodies 2H of the device 1 are provided on a common carrier 9G. The common carrier 9G and the main bodies 2H form for instance a semiconductor wafer. The devices 1 or the main bodies 2H may each have a semiconductor layer sequence which is configured to generate or detect electromagnetic radiation R during operation of the corresponding device 1. The device 1 or the main body 2H may have a radiation transmission region 6 for instance on a front side 1F of the device 1 or of the main body 2H. The radiation transmission region 6 may have an aperture 60 of the device 1 or of the main body 2H.

The carrier 9G can be a growth substrate on which the semiconductor layer sequence is grown, especially epitaxially grown. However, carrier 9G can also be different from such a growth substrate. It is possible that the carrier 9G has conductor tracks, IC chips or transistors. The respective main body 2H may have a semiconductor body 2 (FIGS. 4A to 4D). On the common carrier 9, in particular at wafer level, the main bodies 2H or the semiconductor bodies 2 may be formed as components of a semiconductor structure 20, in particular a continuous semiconductor structure 20. For example, the semiconductor structure 20 can be separated along a plurality of separation lines 1T or mesa trenches 1T into a plurality of semiconductor bodies 2.

The semiconductor structure 20 may comprise a first semiconductor layer 21, a second semiconductor layer 22 and an active zone 23 disposed between the semiconductor layers 21 and 22, wherein the active zone 23 is formed in particular to emit or detect electromagnetic radiation. In particular, the active zone 23 is a pn-junction zone. The semiconductor structure 20 may be based on a III-V or on a II-VI semiconductor compound material. The semiconductor structure 20 is based on a group III-V compound semiconductor material if it comprises in particular at least one element from main group III, such as Al, Ga, In, and one element from main group V, such as N, P, As. In particular, the term "III-V compound semiconductor material" includes the group of binary, tertiary and quaternary compounds containing at least one main group III element and at least one main group V element, such as nitride and phosphide compound semiconductors. Similarly, it applies for a semiconductor structure 20 based on the group II-VI compound semiconductor material.

According to FIG. 3A, a plurality of optical components 10 are applied to the main body 2H or to the semiconductor structure 20. In particular, the optical components 10 can be removed from the composite component 100 and printed individually or in groups on the main bodies 2H or on the semiconductor structure 20 and attached thereto. In a plan view, the optical component 10 can cover, in particular completely cover, a radiation transmission region 6 or an aperture 60 of the associated main body 2H. The number of optical components 10 which are applied to the main bodies 2H or to the semiconductor structure 20 in a single method step may be at least or greater than 4, 10, 100 or 1000.

The attachment and fixing of the optical components 10 to the main bodies 2H or to the semiconductor structure 20 can be performed prior to the forming of the mesa trenches 1T (FIG. 3A) or after the forming of the mesa trenches 1T (FIG. 3B). According to FIGS. 3A and 3B, the optical components 10 and the main bodies 2H or the semiconductor structure 20 can have planar surfaces 1F and 10R and can preferably be mechanically bonded together at the planar surfaces by a direct bonding method. A common interface 5G, which is defined for instance by overlapping areas of the planar surfaces 1F and 10R, is in this case free of a bonding material, for instance free of an adhesion promoter material such as solder or adhesive material. In particular, the connecting surface 5G of the respective device 1 is also planar.

Layers of different materials can be directly adjacent to each other at the common interface 5G.

According to FIG. 3A, the optical components 10 may have mechanical traces of detached or broken retaining elements 3A. The mechanical traces may be remnants or traces of mechanical fracture of one or more retaining tethers 3A, particularly on the side faces of the optical components 10. Alternatively or in addition, such mechanical traces may be found on the rear side 10R of an optical component 10 (FIG. 3C).

The exemplary embodiment shown in FIG. 3C essentially corresponds to the exemplary embodiment shown in FIG. 3A for a method step for producing a plurality of the devices 1. In contrast, the optical component 10 can be attached to the associated main body 2H or to the semiconductor structure 20 by a connection layer 5. The connection layer 5 can comprise an adhesion promoter material, a solder or an adhesive material. In particular, the connection layer 5 may be formed of metallic layers. The retaining columns 3B or remnants or traces of the retaining columns 3B on the rear side 10R of the optical component 10 may be located in places or completely within the connection layer 5.

Especially after fixing the optical components 10, the common carrier 9G can be singulated into a plurality of carriers 9 of the devices 1. A main body 2H, in particular a single main body 2H having a single optical component 10 or a plurality of optical components 10 can be arranged on each singulated carrier 9. Such a device 1 is shown schematically in FIGS. 4A, 4B, 4C and 4D, for example. It is also possible that a plurality of main bodies 2H in particular together with a plurality of optical components 10 are arranged on a single carrier 9. Such a device 1 can be a laser bar.

Figure 4A:
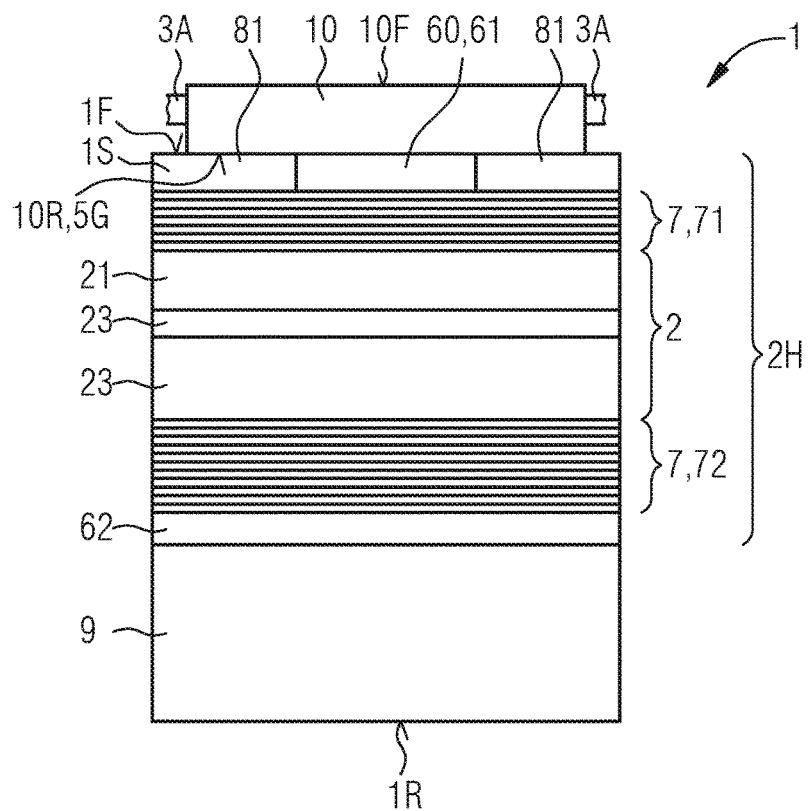

FIG. 4A schematically shows a device 1. The device 1 has a carrier 9, a main body 2H and an optical component 10. The optical component 10 is located on a front side 1F of the main body 2H or of the device 1. The optical component 10 has side faces comprising remnants and/or traces of retaining tethers 3A. The optical component 10 has a rear side 1R formed by a surface of the carrier 9.

The main body 2H comprises a semiconductor body 2 having a first semiconductor layer 21, a second semiconductor layer 22 and an active zone 23 located between the semiconductor layers 21 and 22. Furthermore, the main body 2H comprises a first contact layer 61 and a second contact layer 62 for electrically contacting the semiconductor body 2. In particular, the device 1 is formed as a surface-emitting laser diode or VCSEL (vertical-cavity surface-emitting laser). The semiconductor body 2 can be arranged between a first mirror arrangement 71 and a second mirror arrangement 72. The mirror arrangements 71 and 72 form in particular a laser resonator 7. The mirror arrangements 71 and 72 can be Bragg mirrors, in particular electrically conductive Bragg mirrors made for instance of semiconductor materials.

In a plan view, the first contact layer 61 only partially covers the semiconductor body 2 or the active zone 23. The first contact layer 61 can be passivated laterally by a first insulating layer 81. By means of a first contact layer 61 formed in this way, it can be achieved that electrical charge carriers are impressed into semiconductor body 2, if possible, only in the area of the semiconductor body overlapping with the first contact layer 61. Such a design of the first contact layer 61 can lead to the formation of an aperture 60 of the device 1. The first contact layer 61 can be formed from a transparent and electrically conductive material.

In particular, the optical component 10 and the main body 2H have planar surfaces 1F and 10R, wherein the planar surfaces 1F and 10R are directly adjacent to each other and can form a mechanical connection between the optical component 10 and the main body 2H based on van-der-Waals interactions. The device 1 shown in FIG. 4A can be produced by a method step as shown in FIG. 3A or 3B. The planar surface of the optical component 10 is in particular the rear side 10R of the optical component 10. The planar surface 1F of the main body 2H may be formed by surface of a cover layer 1S of the device 1 or by surfaces of the first contact layer 61 and the first insulating layer 81.

It is possible that the optical component 10 and the main body 2H are mechanically connected to each other by a connection layer 5. Such a connection layer 5 is shown for example in FIG. 4B. The device 1 shown in FIG. 4B can be manufactured by a method step as shown in FIG. 3C.

Figure 4B:
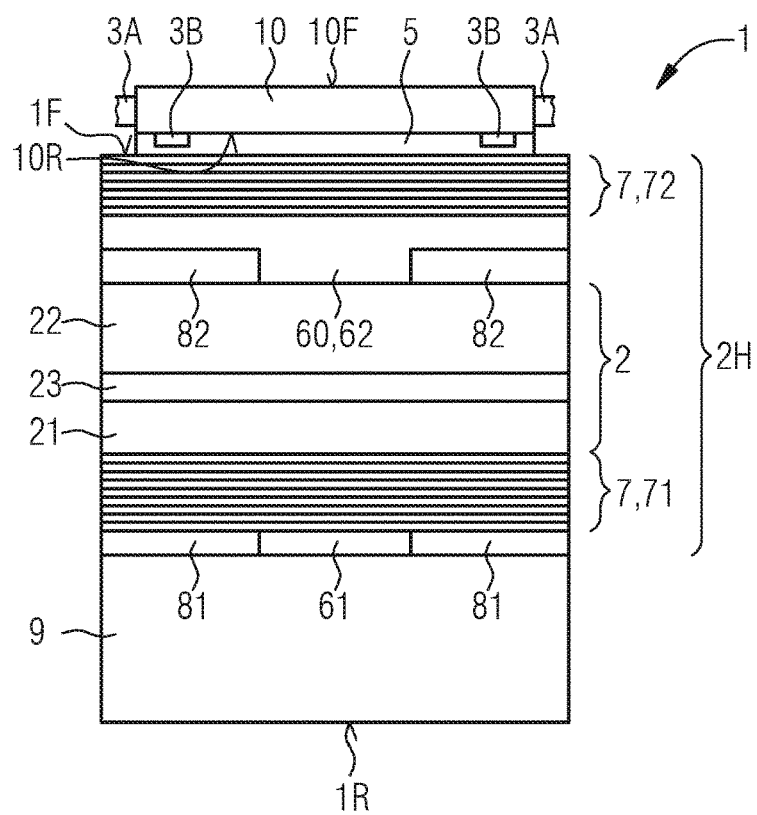

The exemplary embodiment shown in FIG. 4B essentially corresponds to the exemplary embodiment for a device 1 shown in FIG. 4A. As a further difference, the second mirror arrangement 72 can be electrically insulating. The second mirror arrangement 72 can form a cover layer 1S of the main body 2H. A surface of the second mirror arrangement 72 or of the cover layer 1S facing the optical component 10 can be formed to be flat or planar. Deviating from FIG. 4B, the optical component 10 can be mechanically connected to the main body 2H by a direct bonding method.

According to FIG. 4B, the main body 2H has a second insulating layer 82 having an opening. In the opening, the semiconductor body 2, in particular the second semiconductor layer 22, may be exposed in areas. For the electrically contacting the second semiconductor layer 22 or the semiconductor body 2, the main body 2H has a second contact layer 62 which extends in particular into the opening of the second insulating layer 82. Outside the opening, the second contact layer 62 can cover, in particular completely cover, the second insulating layer 82. In the region of the opening of the second insulating layer 82, the second contact layer 62 may be in direct or indirect electrical contact with the semiconductor body 2 or with the second semiconductor layer 22. The opening of the second insulating layer 82 can thus define an aperture 60 of the device 1. The second contact layer 62 is preferably made of a radiation-transmitting and electrically conductive material.

Figure 4C:
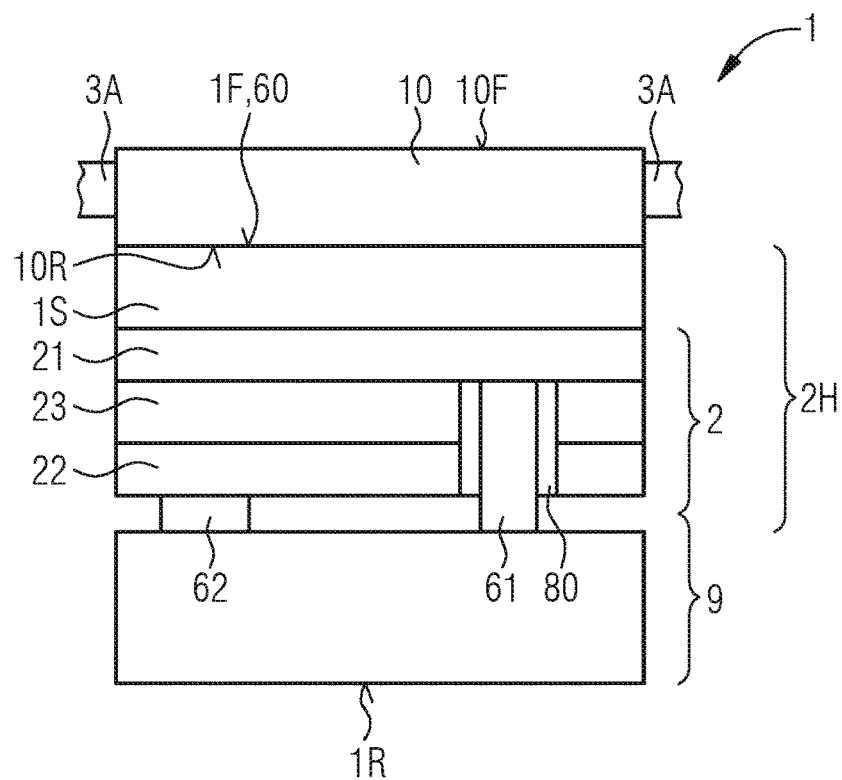
Figure 4D:
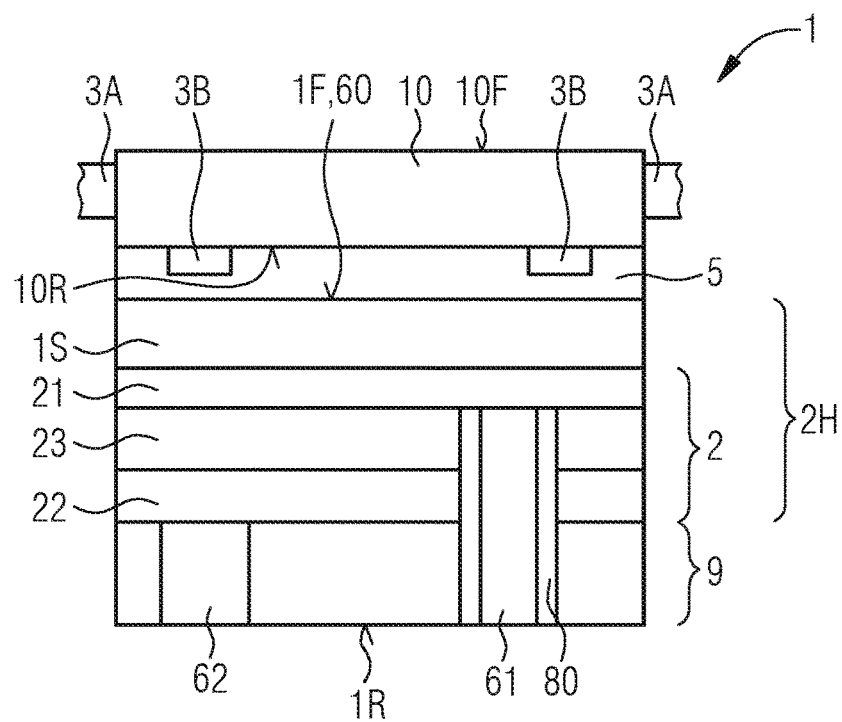

The exemplary embodiments shown in FIGS. 4C and 4D correspond essentially to the exemplary embodiments of a device 1 shown in FIGS. 4A and 4B. In deviation thereof, the device 1 or the main body 2H may be a surface-mounted device or a surface-mounted main body. The device 1 is in particular an optoelectronic semiconductor chip, for instance an LED.

As shown in FIG. 4C, the main body 2H can be in the form of a flip chip or of a semiconductor chip having rear side contacts. The first contact layer 61 may be in the form of a through-via which extends throughout the second semiconductor layer 22 and the active zone 23 into the first semiconductor layer 21. The through-via is completely surrounded in the lateral directions by the semiconductor body 2. The through-via can be electrically isolated from the second semiconductor layer 22 and from the active zone 23 by an insulating layer 80.

The cover layer 1S can be made of an electrically insulating material. It is also possible that the cover layer 1S is a growth substrate on which the semiconductor body 2 is epitaxially grown. The substrate 9 may have electrical conductor tracks which are in electrical contact with the contact layers 61 and 62 of the main body 2H, for example.

The exemplary embodiment shown in FIG. 4D essentially corresponds to the exemplary embodiment of a device 1 shown in FIG. 4C. In contrast to this, the carrier 9 can have through-contacts, whereby the through-contacts are in electrical contact in particular with the contact layers 61 and 62, so that the contact layers 61 and 62 can be electrically contacted for instance on the rear side 1R of the device 1.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

LIST OF REFERENCE NUMERALS

100 Composite component
10 Optical component
10G base body of the optical component
10E Optical element
10E1 Matrix material of the optical element
10E2 Substructures of the optical element
10F Front side of the optical component
10R Rear side of the optical component
10S Cover layer/protective layer of the optical component
1 Device
1F Front side of the device
1R Rear side of the device
1S Cover layer
1T Separation line, mesa trench
2H Main body of the device
2 Semiconductor body
20 Semiconductor structure
21 First semiconductor layer
22 Second semiconductor layer
23 Active zone
3 Retaining structure
30 Retaining bar
3A Retaining element, retaining tether
3B Retaining element, retaining column
4 Sacrificial layer
4H Cavity
4T Separation trench
5 Connection layer
5G Common interface
6 Radiation transmission region
60 Aperture
61 First contact layer
62 Second contact layer
7 Laser resonator
71 First mirror arrangement
72 Second mirror arrangement
80 Insulating layer
81 First insulating layer
82 Second insulating layer
9 Carrier
9 Common carrier/common growth substrate
90 Intermediate carrier
R Radiation

The invention claimed is:

1. A method of producing a plurality of transferable optical components on a common intermediate carrier, wherein the optical components are configured to shape a light beam and wherein a retaining structure having a plurality of retaining elements forms a mechanical connection between the intermediate carrier and the optical components, comprising:

attaching or forming a plurality of optical components on the intermediate carrier, wherein a sacrificial layer is arranged in the vertical direction at least in places between the intermediate carrier and the optical components; and removing the sacrificial layer, as a result of which the optical components are mechanically connected to the intermediate carrier only via the retaining structure, wherein the retaining elements release the optical components under mechanical load, so that the optical components are formed to be detachable from the intermediate carrier and thus transferable, wherein the method is further configured for producing a plurality of devices, wherein the retaining elements release the optical components under mechanical load so that the optical components are detached from the intermediate carrier by breaking the retaining elements and/or by detaching the retaining elements from the optical components, and wherein the released components are printed on a plurality of main bodies of the devices, each of the main bodies comprising a semiconductor body having an active zone configured to generate or detect electromagnetic radiation, wherein the optical components each have a transparent base body and the transparent base body contains photonic crystals which form the optical element of the optical component.

2. A composite component having a plurality of optical components, a removable sacrificial layer, a retaining structure and a common intermediate carrier, wherein the optical components each comprise an optical element for shaping a light beam, the sacrificial layer is arranged vertically at least in places between the intermediate carrier and the optical components, the retaining structure comprises a plurality of retaining elements, wherein the retaining structure and the sacrificial layer form a mechanical connection between the intermediate carrier and the optical components, and without the sacrificial layer, the optical components are mechanically connected to the intermediate carrier only via the retaining structure, wherein the retaining elements are formed in such a way that under mechanical load they release the optical components, so that the optical components are formed to be detachable from the intermediate carrier and thus transferable, the optical components each have a transparent base body, and wherein the transparent base body contains photonic crystals which form the optical element of the respective component.

3. The composite component according to claim 2, wherein the optical element of the respective component is embedded in the associated transparent base body.

4. The composite component according to claim 3, wherein the component has a planar rear side facing the intermediate carrier and an at least flat front side facing away from the intermediate carrier.

5. The composite component according to claim 2, wherein the optical element of the respective component is formed by an optical layer which is arranged on the associated transparent base body.

6. The composite component according to claim 2,
wherein the retaining elements comprise retaining tethers which are located sidewards to the optical components and are formed to be breakable or detachable under mechanical load when the optical components are removed.

7. The composite component according to claim 2,
wherein the retaining elements comprise retaining columns which are located below the optical components, are arranged in the vertical direction exclusively between the intermediate carrier and the optical components and are formed to be breakable or detachable under mechanical load when the optical components are removed.

8. The composite component according to claim 2,
wherein the retaining elements are formed with respect to their geometry and/or material composition in such a way that they are formed to be breakable when the associated optical component is pressed or removed.

9. The composite component according to claim 2, wherein
the sacrificial layer forms a common boundary layer between the intermediate carrier and the optical components, and
without the sacrificial layer, a cavity is formed between the intermediate carrier and the optical components or between the optical components, wherein the retaining elements are directly adjacent to the cavity in places or are arranged in the cavity.

10. A method for producing one or a plurality of devices comprising:
providing the composite component according to claim 2;
removing the sacrificial layer;
removing one or a plurality of optical components using a stamp or a plurality of stamps, wherein the retaining elements release the optical components under mechanical load of the stamp or stamps so that the optical components are detached from the intermediate carrier;
printing the component or the plurality of components on a main body of the device or on a plurality of main bodies of the devices, wherein the main body comprises a semiconductor body having an active zone configured to generate or detect electromagnetic radiation; and
separating the stamp or stamps from the optical component or components.

11. The method according to claim 10,
wherein the optical component is fixed to the associated main body of the device by a connection layer.

12. The method according to claim 10,
wherein the optical component and its associated main body each have a planar surface and are mechanically connected to one another at the planar surfaces using a direct bonding process.

13. A device comprising a main body and an optical component, wherein
the main body comprises a semiconductor body having an active zone configured for generating or detecting electromagnetic radiation,
the optical component has an optical element for shaping a light beam,
the optical component is printed on the main body and contains mechanical traces of detached or broken retaining elements,
the optical component has a transparent base body,
the optical element is arranged on the transparent base body, or is embedded or buried in the transparent base body,
an entire front side of the main body is planar,
an entire rear side of the optical component is planar, and
wherein the front side of the main body and the rear side of the optical component are directly adjacent to one another and form a mechanical connection based on van-der-Waals interactions between the optical component and the main body.

14. The device according to claim 13,
wherein the main body is a surface emitting laser diode and the optical component is configured to shape a light beam generated during operation of the laser diode.

15. The device according to claim 13, wherein the transparent base body contains photonic crystals which form the optical element of the optical component.

* * * * *